(12) United States Patent
Liu

(10) Patent No.: US 6,879,186 B2
(45) Date of Patent: Apr. 12, 2005

(54) PSEUDO-DYNAMIC LATCH DERACER

(75) Inventor: Yichiuh Liu, Fremont, CA (US)

(73) Assignee: Intel Corporation, Santa Clara, CA (US)

(*) Notice: Subject to any disclaimer, the term of this patent is extended or adjusted under 35 U.S.C. 154(b) by 98 days.

(21) Appl. No.: 10/608,009

(22) Filed: Jun. 30, 2003

(65) Prior Publication Data

US 2004/0263206 A1 Dec. 30, 2004

(51) Int. Cl.[7] .................................................. H03K 19/096
(52) U.S. Cl. ............................................. 326/98; 326/95
(58) Field of Search ................................ 326/93, 95–98; 327/199–201

(56) References Cited

U.S. PATENT DOCUMENTS

| | | | |
|---|---|---|---|
| 5,896,046 A | * | 4/1999 | Bjorksten et al. ............. 326/98 |
| 6,542,006 B1 | * | 4/2003 | Sprague et al. ............... 326/95 |
| 6,677,783 B2 | * | 1/2004 | Samaan ....................... 326/96 |

* cited by examiner

Primary Examiner—James H. Cho
(74) Attorney, Agent, or Firm—Fleshner & Kim, LLP

(57) ABSTRACT

An apparatus and method for a pseudo-dynamic latch are disclosed. A deracer circuit includes a first logic gate configured to receive a data signal from a domino logic circuit and to invert the data signal. A second logic gate is configured to receive the inverted data signal and an inverted select signal and to generate a select signal. Thus, the deracer circuit is configured to prevent the select signal from being high when a precharge edge of a data signal arrives.

30 Claims, 10 Drawing Sheets

PSEUDO-DYNAMIC LATCH DERACER

BACKGROUND OF THE INVENTION

1. Field of the Invention

The invention relates to integrated circuits and in particular to logic timing solutions for a pseudo-dynamic latch.

2. Background of the Related Art

One of problem of domino logic circuits is they cannot implement inverting logic (e.g., NAND, NOR, and the like). Accordingly, to implement inverting logic with domino logic circuits, pseudo-dynamic latches can be used to implement inverting logic without additional stage delays, as is known in the art.

A pseudo-dynamic latch is simply a pseudo-dynamic circuit with a latch function, as illustrated in FIG. 1. The pseudo-dynamic latch is known in the art and therefore a detailed description of the circuit will not be presented.

Referring to FIG. 1, select signals S1 and S2 are domino signals, and some of the data inputs are domino, and some are domino-precharge (or buffered domino-precharge), e.g., data signal D1, as will be appreciated by those skilled in the art. The selects S1 and S2 are mutually exclusive, and can arrive relatively earlier than the data signals D1 and D2. When buffered inverted clock signal NCKB is high, it is in the evaluation phase, and when NCKB goes low, it is in hold state just like a conventional latch. However, a special case occurs when none of the select signals S1 and S2 are on. In this case, the circuit may be in the evaluation phase as determined by the status of NCKB, but both the pull-up 130 and pull-down paths 140 and 150 will be off due to the selects being off Therefore, the circuit is in functionally in the hold mode.

As the operating frequency and complexity of logic circuits increase, the potential for timing errors increase and margins decrease. Modern circuit design includes complex modeling of signals with in a circuit and to determine potential errors due to timing problems, such as min-delay, max-delay, and the like. Accordingly, reliable timing is important for reliable operation of logic circuits.

For example, assume a circuit design showed a speed path in one of the domino-precharge signals (e.g., data signal D1). Initially, the domino-precharge signal from domino driver 102 had a buffer 110 used as the deracer. In order to solve the speed path problem, the buffer 110 could be removed. However, subsequent analysis of the design then indicated a violation in the min-delay (i.e., the minimum delay for consistent data latching). An illustration of this problem is provided in the following section in relation to FIG. 2.

Referring to FIG. 2, assume the node PD is high during the evaluation phase. If signal NCKB does not go low by the time the precharge value of data signal D1 arrives (e.g., time 206), then a min-delay situation will occur. As discussed above select signal S1 goes high at time 202, before data signal D1 arrives at time 204. However, since at time 208 precharge data signal D1 is high, select S1 is still high, and NCKB has not gone low due to the skew 201, the new data held 210 is the wrong value. That is at time 208 the wrong value of PD will be latched. In this example, the min-delay was mostly due to the high skew 201 between data signal D1 and the buffered inverted clock signal NCKB. Those skilled in the art will appreciate that the skew can be due to a variety of sources, such as the effects of process variation on the clock, and the like. Therefore, as illustrated in FIG. 2, the related art circuit does not provide for reliable operation.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
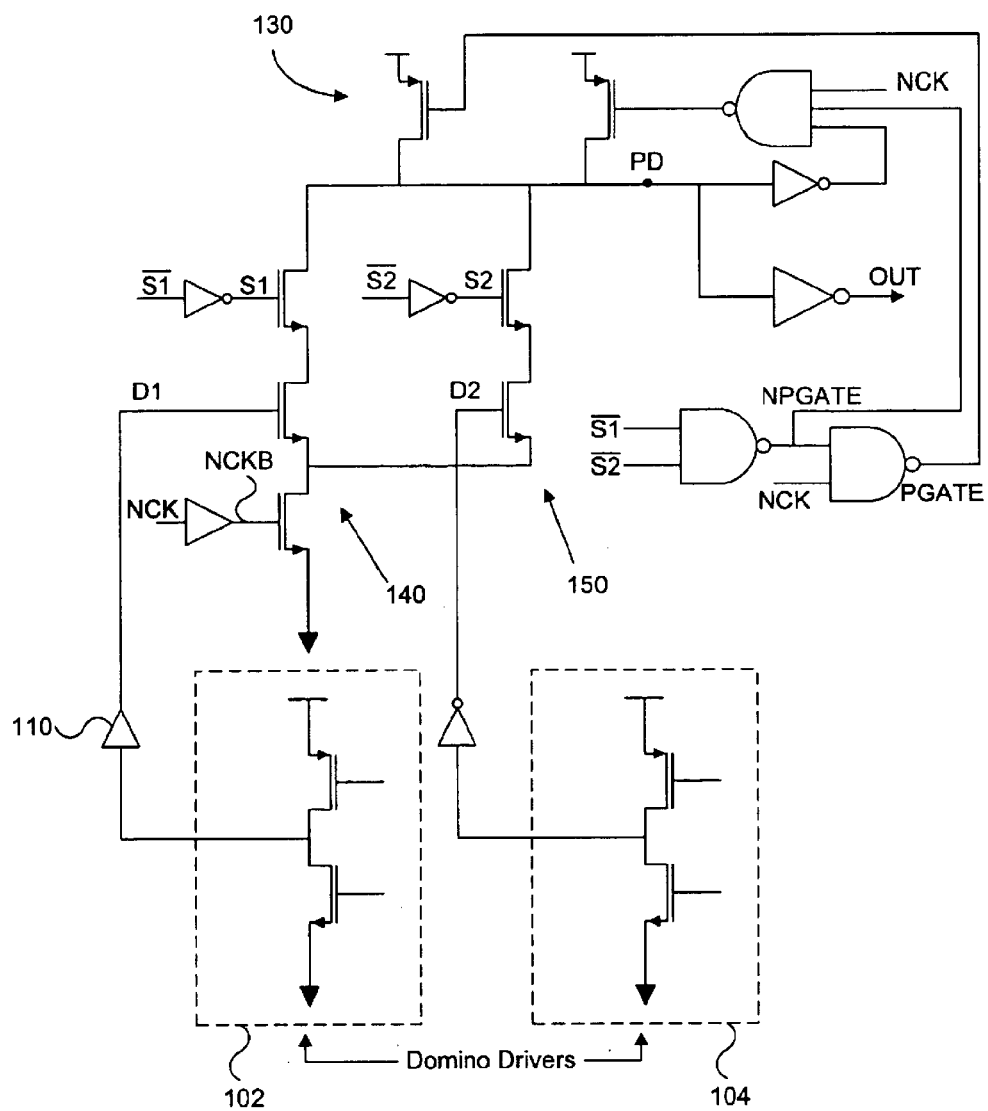
FIG. 1 illustrates a schematic diagram of a pseudo-dynamic latch in accordance with the related art.
Figure 2:
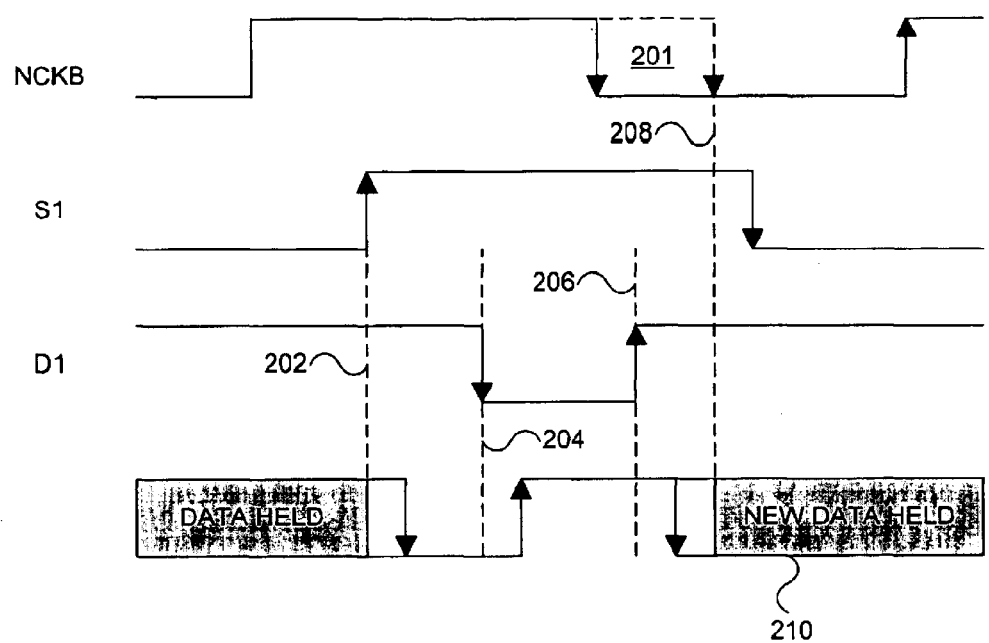
FIG. 2 illustrates a timing diagram of signals of the pseudo-dynamic latch in accordance with the related art.

In the following detailed description of preferred embodiments, reference is made to the accompanying drawings that show, by way of illustration, specific embodiments in which the invention can be practiced. In the drawings, like numerals describe substantially similar components throughout the several views. These embodiments are described in sufficient detail to enable those skilled in the art to practice the invention. Other embodiments may be utilized, and structural, logical, and intellectual changes may be made without departing from the scope of the present invention. Moreover, it is to be understood that various embodiments of the invention, although different, are not necessarily mutually exclusive. For example, a particular feature, structure, or characteristic described in one embodiment may be included within other embodiments. Accordingly, the following detailed description is not to be taken in a limiting sense, and the scope of the present invention is defined only by appended claims, along with the full scope of equivalence to which such claims are entitled.

In order to solve the min-delay problem discussed in the foregoing section, a solution was designed that does not use a complex deracing structure to resolve the min-delay problem and does not degrade the speed path. Since the select signal S1 arrives before the data signal D1, the deracer circuit can be used on S1 and not affect the critical data path, as can be observed from FIGS. 4A and 4B. Particularly, preventing the select signal S1 from being high when a precharge edge of data signal D1 arrives allows for reliable latch operation. This observation can serve as a basis for understanding the following description of embodiments of the present invention.

Figure 3A:
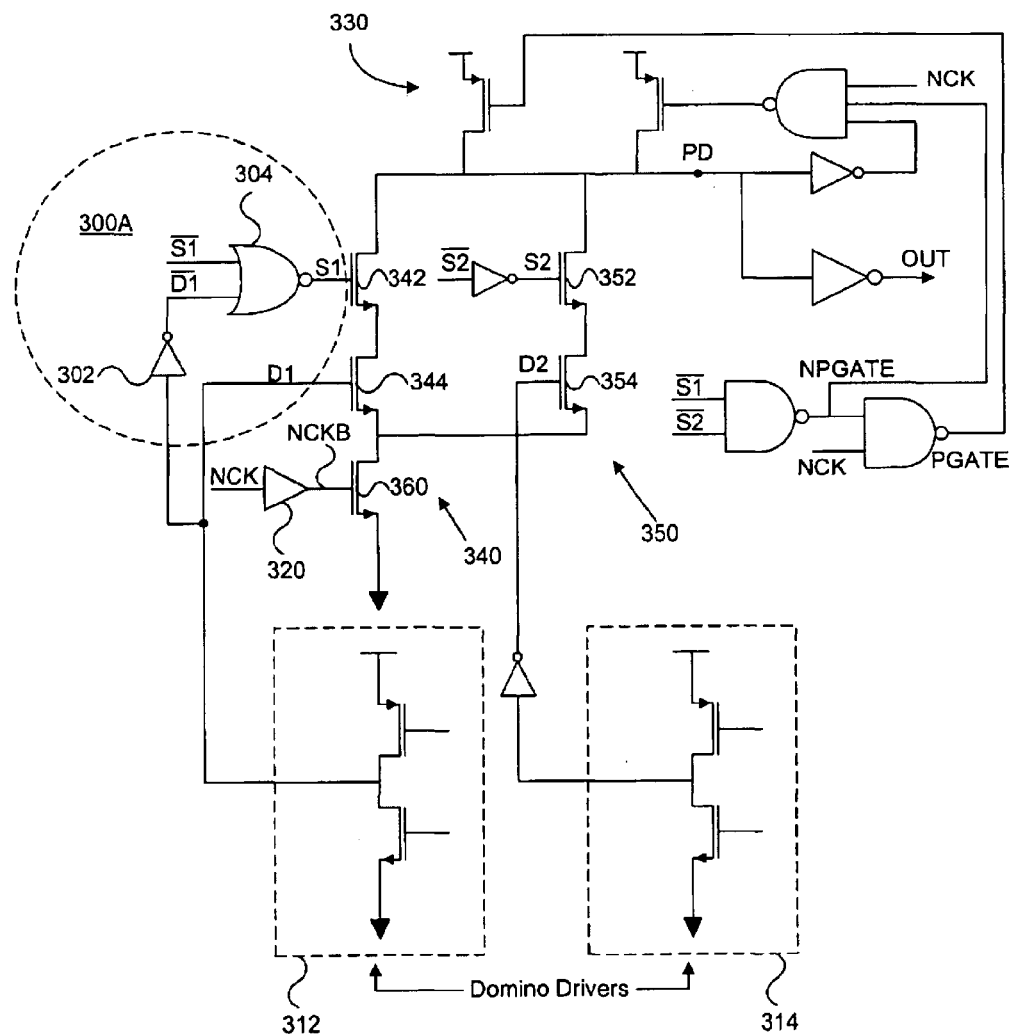
FIGS. 3A–C illustrate schematic diagrams of a pseudo-dynamic latch in accordance with embodiments of the present invention.
Figure 4A:
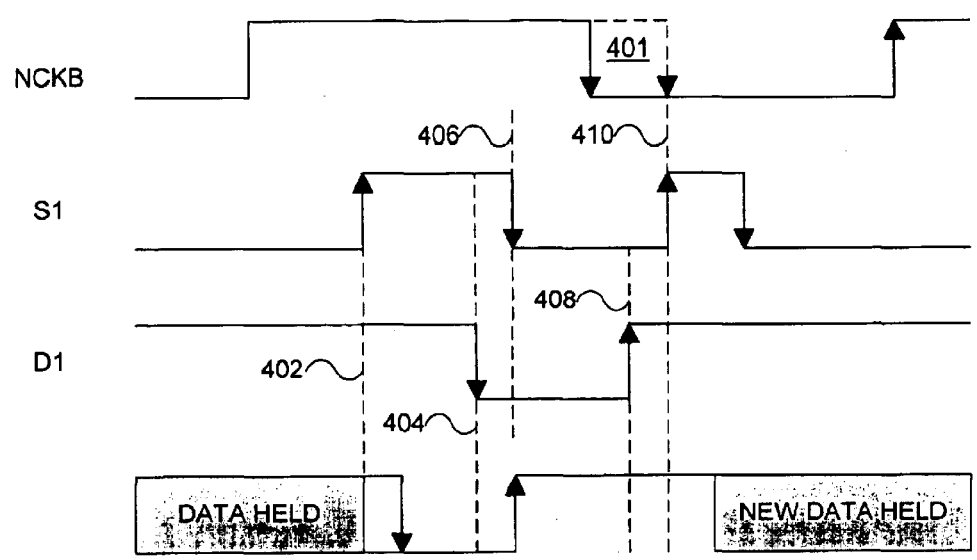
FIGS. 4A and 4B illustrate timing diagram of signals of the pseudo-dynamic latch in accordance with embodiments of the present invention.

Referring to FIG. 3A, a schematic diagram of a pseudo-dynamic latch in accordance with an embodiment of the present invention is illustrated that solves the previously described min-delay problem. The pseudo-dynamic latch circuit including deracer circuit 300A ensures that the select signal S1 is not high when a precharge edge of data signal D1 arrives. Deracer circuit 300A comprises two gates, for example, inverter 302 and NOR gate 304, as illustrated in FIG. 3A. However, those skilled in the art will appreciate that other logic configurations can be used. Reference will now be made to FIG. 4A, which is a timing diagram that illustrates the solution rendered by the circuit of FIG. 3A.

Referring to FIG. 4A, initially, select signal S1 will turn on and data signal D1 is precharged high, thus node PD will be pulled low at time 402. When a critical edge 404 of data signal D1 arrives from domino driver 312, which is high going low, the PD node will be charged high. At this point, whether S1 is high or low will not change the value of node PD, since the transistor 342 controlled by select signal S1 is in series with the transistor 344 controlled by data signal D1, as can be seen with reference to FIG. 3A.

Specifically, referring to FIG. 3, n-type metal oxide semiconductor (NMOS) pull-down transistors 342 and 344 are in series with clocked NMOS transistor 360 and form pull down path 340. Likewise, NMOS pull-down transistors 352 and 354 are in series with clocked NMOS transistor 360 and form pull down path 350. Accordingly, for a pull down path to be active (i.e., pull down node PD) all transistors in the pull down path must be on. Accordingly, pull down path 340 is active when select signal S1 driving transistor 342, data signal D1 driving transistor 344 and signal NCKB driving transistor 360 are all high. Likewise, pull down path 350 is active when select signal S2 driving transistor 352, data signal D1 driving transistor 354 and signal NCB driving transistor 360 are all high. On the contrary, those skilled in the art will appreciate that pull up path 330 is active when the input signal (e.g., PGATE) is low since the pull up transistor is a p-type metal oxide semiconductor (PMOS). The foregoing description was provided solely for illustration and not for limitation. Those skilled in the art will appreciate that alternative arrangements of the circuit can include alternative arrangements of the pull up and pull down paths and of the p-type and n-type transistors along with corresponding logic changes. The foregoing description briefly describes some of the illustrated elements as a basis for further discussion of the following embodiments of the present invention and related timing diagrams. Since the min-delay problem discussed above occurs on the D1 portion of the circuit, only this portion of the circuit will be further discussed in detail.

Referring to both FIGS. 3A and 4A, in the illustrated embodiment the deracer circuit 300A will pull the select signal S1 to low at time 406, two gate delays after signal D1 goes low at time 404. The two gate delay is due to D1 being inverted by inverter 302 and then the output D1-bar being NORed with S1-bar by NOR gate 304, as illustrated in FIG. 3A. Likewise, the select signal S1 will not go high until time 410, which is two gate delays after data signal D1 is precharged to high at time 408. Accordingly, the min-delay is corrected as long as the select signal S1 goes high after NCKB goes low, which is illustrated in FIG. 4A.

Figure 3B:
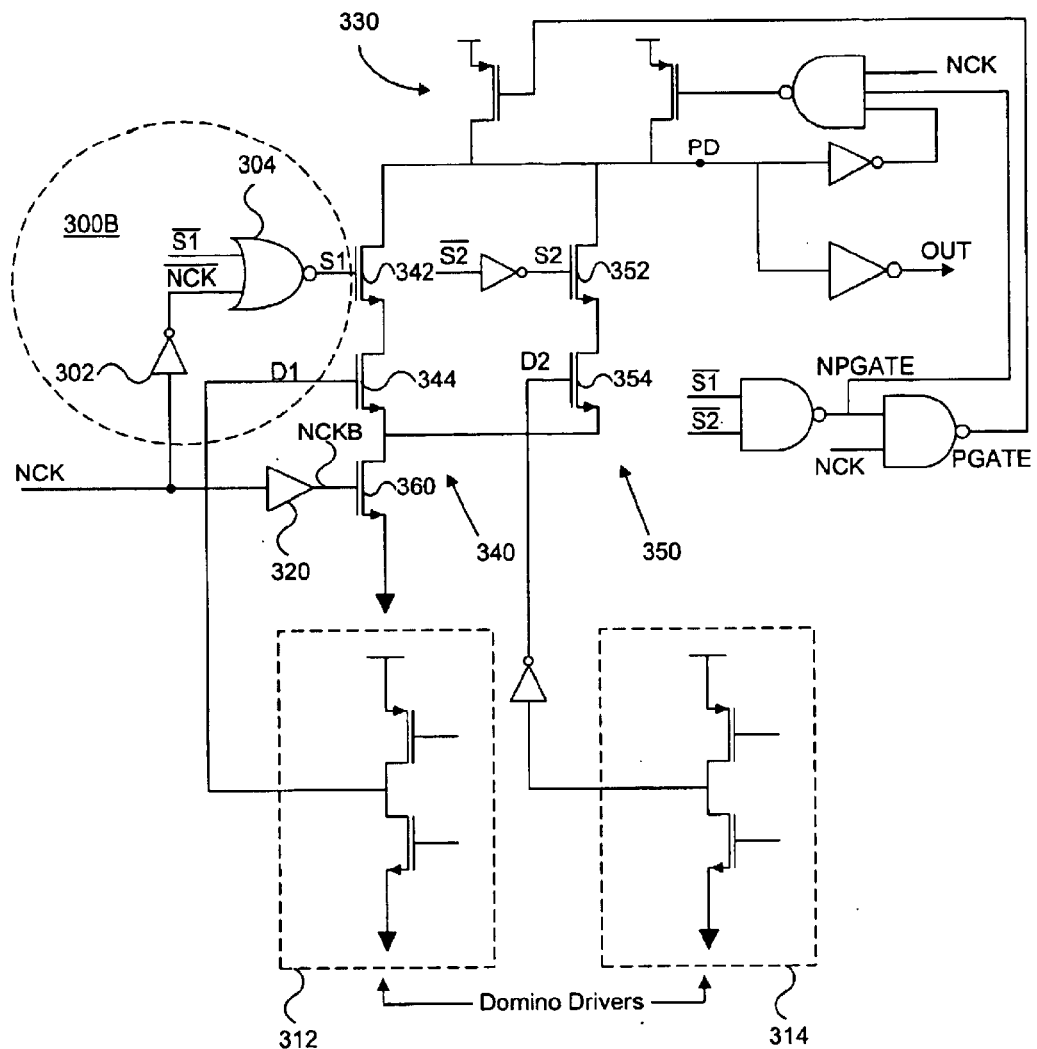

Another embodiment of the present invention uses a similar structure as illustrated in FIG. 3A (i.e., the deracer circuit 300A the dotted circle). However, instead of NORing the inverted logic select signal S1-bar, and inverted data signal D1-bar, signal S1-bar and NCK-bar can be NORed in deracer circuit 300B, as illustrated in FIG. 3B. Specifically, NCK is inverted by inverter 302 to provide signal NCK-bar to NOR gate 304. NOR gate 304 generates select signal S1 by NORing NCK-bar and S1-bar, as illustrated. In this embodiment select signal S1 will be deactivated two gate delays after NCK falls. This will be approximately the same as the fall of NCKB. The timing of this embodiment is discussed below, with reference to FIG. 4B.

Figure 3C:
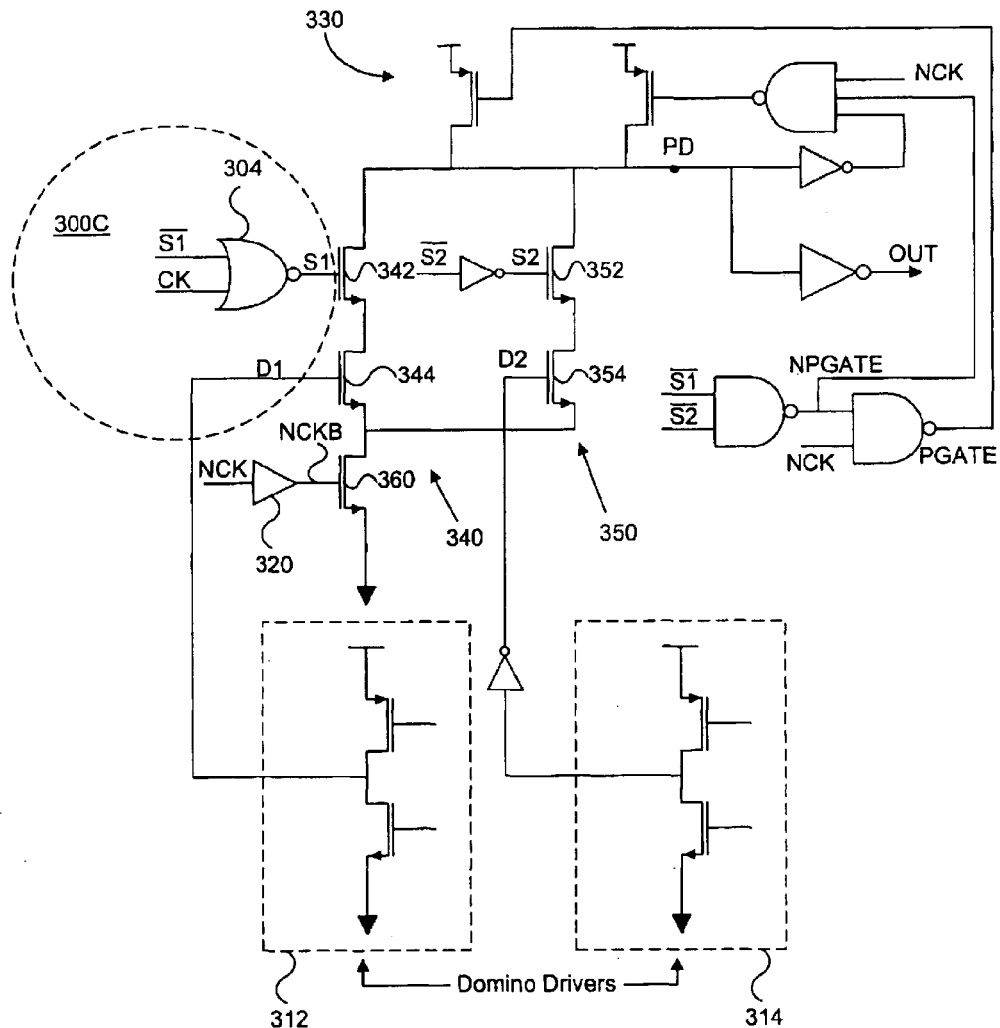

FIG. 3C illustrates another embodiment of the present invention uses a clock signal CK that can be introduced to improve the timing of the embodiment of FIG. 3B. In this embodiment, the NOR gate 304 has input signals S1-bar and clock CK, as illustrated in deracer circuit 300C. This deracer circuit 300C causes select signal S1 to fall one gate delay after clock signal CK rises, which is the falling edge of NCK. However, this embodiment can consume extra power because of the extra gate and wire capacitance needed to route the clock signal CK, as will be appreciated by those skilled in the art. For example, one extra track in the layout is used to add clock signal CK. Additionally, although this embodiment gains one gate delay of margin over the embodiment of FIG. 3B, the margin increases only if the gate delay decreases. There can be a limit to how much margin can be gained depending on how fast the NOR gate delay can be attained. Further, introducing one more clock signal CK will introduce more skew to the circuitry, which tends to make the circuitry less reliable. The timing of this embodiment is also discussed below, with reference to FIG. 4B.

Figure 4B:
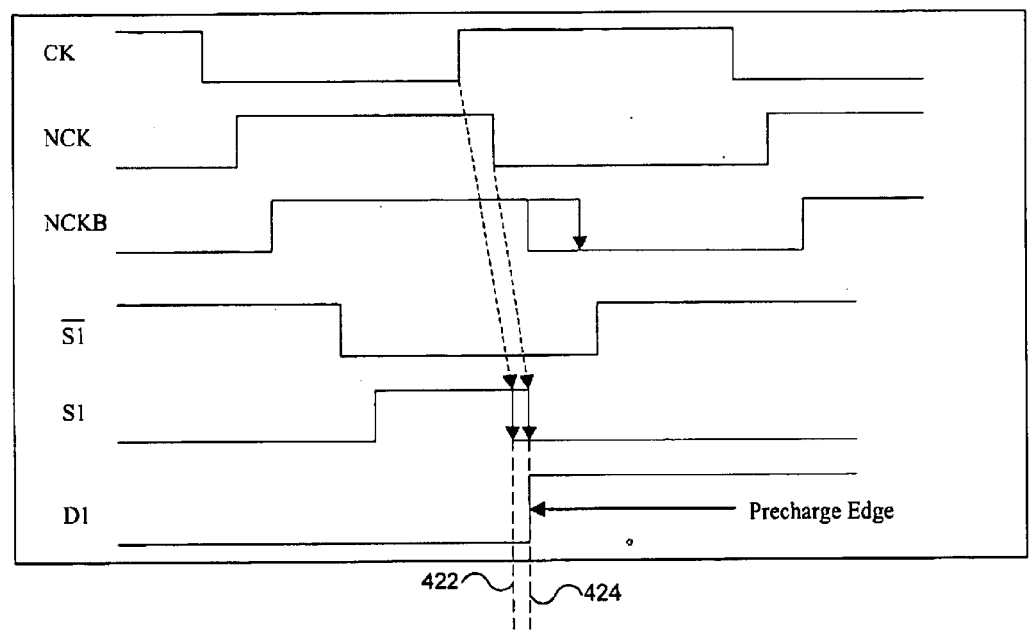

FIG. 4B illustrates a timing diagram for the embodiments of FIGS. 3B and 3C. The clock signal CK is illustrated at the top of the timing diagram. The result of the deracer circuit 300C with respect to select signal S1 is illustrated at time 422. The result of the deracer circuit 300B with respect to select signal S1 is illustrated at time 424. Since signal S1-bar is NORed with the clock signal CK in deracer circuit 300C, the select signal S1 goes low at time 422 after the rising edge of clock signal CK. Likewise, S1 goes low at time 424 after the falling edge of inverted clock signal NCK, since the S1-bar signal is NORed with the NCK-bar signal in deracer circuit 300B. Time 424 also corresponds to the precharge edge of the data signal 424. Both deracer circuits 300B and 300C result in the select signal S1 being low at the precharge edge of data signal D1. However, as noted above, using the clock signal CK gains a one gate delay margin (i.e., the difference between time 422 and 424), as illustrated in FIG. 4B.

However, the embodiment of FIG. 3A does not add extra load to the clock, requires no additional track for new signals, and is very robust. Further, the margin can be increased by increasing the delay of inverter 302 that generates the D1-bar signal that is inputted into NOR gate 304. Those skilled in the art will appreciate that increasing the delay is easier to achieve than decreasing the delay. Another advantage of increasing the delay of the inverter 302 is that it does not affect the speed of the rising edge of S1. The NOR gate 304 causes the select signal SI rising edge to occur on the falling of S1-bar and D1-bar. Further, one can easily see from FIG. 4A that data signal D1 rises during the NCKB low phase. Consequently, there is plenty of time for D1-bar to fall to low before S1-bar falls to low (because S1-bar falls to low during NCKB high phase). Therefore, the min-delay margin can increase without aggravating the max-delay margin. The max-delay margin for select signal S1 is increased because it is generated by NOR gate 304, instead of using a simple inverter. However, the increase in delay is minimal because S1 arrives significantly earlier compared to the data signal D1.

Accordingly, an embodiment of the present invention includes an apparatus comprising a pseudo-dynamic latch and a deracer circuit configured to prevent a select signal from being high when a precharge edge of a data signal arrives. An embodiment of the pseudo-dynamic latch and a deracer circuit is illustrated in FIG. 3A. The deracer circuit 300A includes a first logic gate 302 (e.g., an inverter) configured to receive a data signal D1 from a domino logic circuit and to invert the data signal D1. A second logic gate 304 is also included and is configured to receive the inverted data signal D1-bar and an inverted select signal S1-bar and to generate a select signal S1. The deracer circuit 300A is configured to generate a state change of the select signal S1 two gate delays after a state change of the data signal D1, as illustrated in FIG. 4A. Thus, the deracer circuit 300 is configured to prevent the select signal S1 from going to a high state before the pseudo-dynamic latch goes into a hold state from an evaluate state (e.g., at time 410).

Additionally, an alternative embodiment of the present invention includes a deracer circuit comprising a first logic gate 302 and second logic gate 304 (e.g., as illustrated in FIG. 3B). The first logic gate 302 is configured to receive an inverted clock signal NCK and to invert the inverted clock signal and generate NCK-bar. The second logic gate 304 is configured to receive the signal NCK-bar and an inverted select signal S1-bar and to generate a select signal S1. Thus, the deracer circuit 300B is configured to prevent the select signal S1 from going to a high state before the precharge edge of the data signal D1 arrives.

Further, another embodiment of the present invention includes a deracer circuit 300C comprising a logic gate 304 (e.g., as illustrated in FIG. 3C). The logic gate 304 is coupled to a clock signal CK and an inverted select signal S1-bar. The logic gate 304 generates a select signal S1. Thus, the logic gate 304 prevents the select signal S1 from going to a high state before the precharge edge of the data signal D1 arrives.

Figure 5:
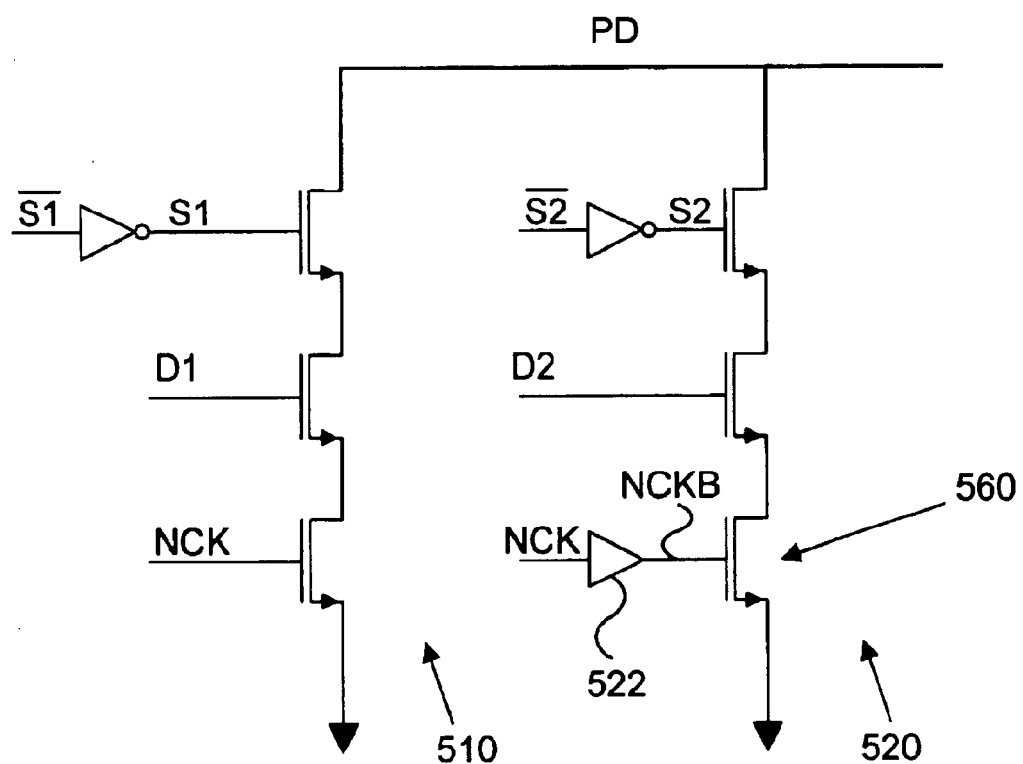
FIG. 5 illustrates a schematic diagram of a pseudo-dynamic latch in accordance with another embodiment of the present invention.

Another solution is illustrated for the pseudo-dynamic latch circuit is illustrated in FIG. 5. For purposes of illustration, only the pull down paths 510 and 520 of data signals D1 and D2 are illustrated. As can be seen from a comparison of FIG. 1 and FIG. 5, an additional NMOS transistor 560 has been added in the D2 pull down path. Additionally, the inverted clock signal NCK is not buffered in the D1 pull down path 510, but is buffered by buffer 522 in the D2 path 520. This allows for removal of min-delay buffer 110 and improved timing in the data signal D1 path. However, this improvement in the data signal D1 path comes at the cost of increased load and power consumption on the inverted clock signal NCK. Further, additional transistor 502 increases the area used to realize the circuit and increases power consumption.

Accordingly, embodiments of the present invention do not aggravate the max-delay margin while increasing the min-delay margin with robustness. Conventional min-delay deracers will involve a tradeoff between max-delay and min-delay margins. Those skilled in the art will appreciate that embodiments of the present invention are useful in any circuit design that uses pseudo-dynamic latches in the similar way. An example of a use of this pseudo-dynamic latch is a multiplexer (mux) latch in a microprocessor.

Figure 6:
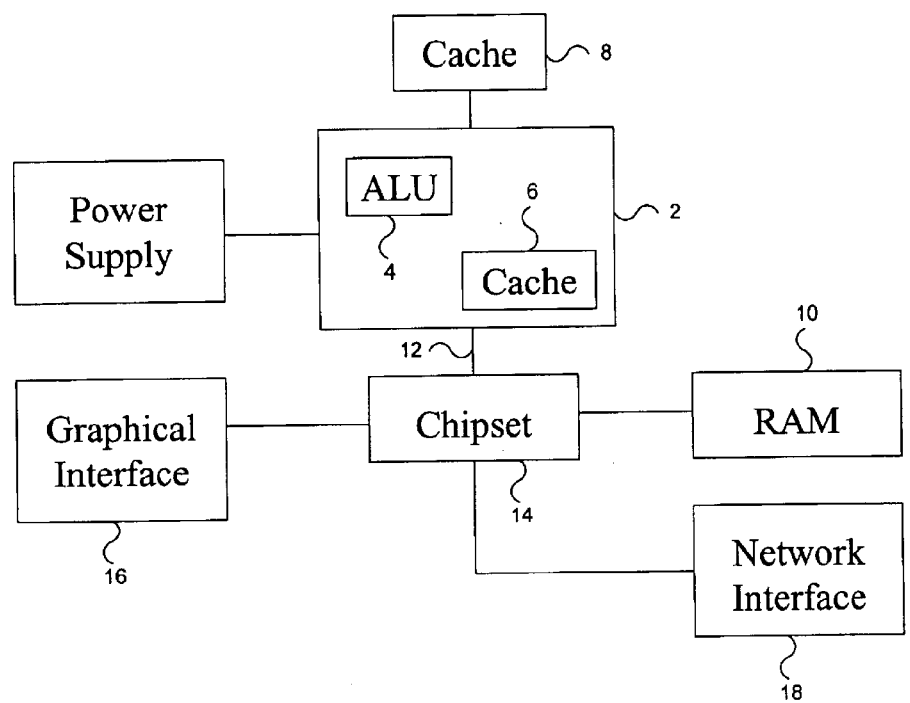
FIG. 6 illustrates a system level block diagram of a computer system according to an embodiment of the present invention.

As can be appreciated from the foregoing description, embodiments of the present invention can be use in a wide variety of applications including computer systems. FIG. 6 shows an exemplary illustration of a computer system. The computer system can include a microprocessor 2, which can include many sub-blocks such as an arithmetic logic unit (ALU) 4 and an on-die cache 6. The microprocessor 2 may also communicate to other levels of cache, such as off-die cache 8. Higher memory hierarchy levels such as system memory 10 are accessed via host bus 12 and a chip set 14. In addition, other off-die functional units such as a graphics accelerator 16 and a network interface controller 18, to name just a few, may communicate with the microprocessor 2 via appropriate busses or ports. Embodiments of the present invention can include system components that use pseudo-dynamic latches, such as an ALU, multiplexer, microprocessor, memory circuits, and the like.

Accordingly, and embodiment of the present invention can include a system comprising: a microprocessor; and an off-die component in communication with the microprocessor. The microprocessor comprises a pseudo-dynamic latch having a deracer circuit as detailed in the foregoing description. The deracer circuit comprises a first logic gate and a second logic gate. The first logic gate is configured to receive a data signal from a domino logic circuit and to invert the data signal. The second logic gate is configured to receive the inverted data signal and an inverted select signal and to generate a positive select signal.

Figure 7A:
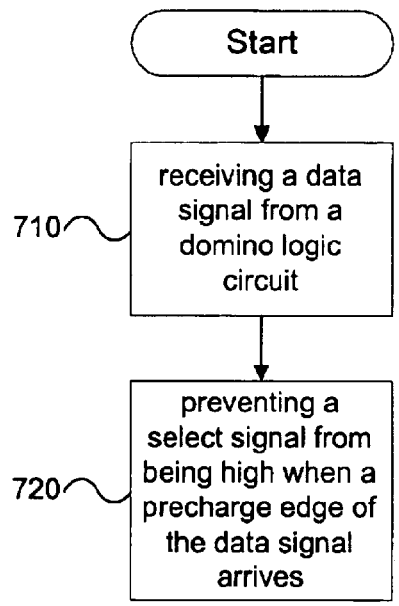
FIGS. 7A and 7B illustrate methods according to embodiments of the present invention.
Figure 7B:
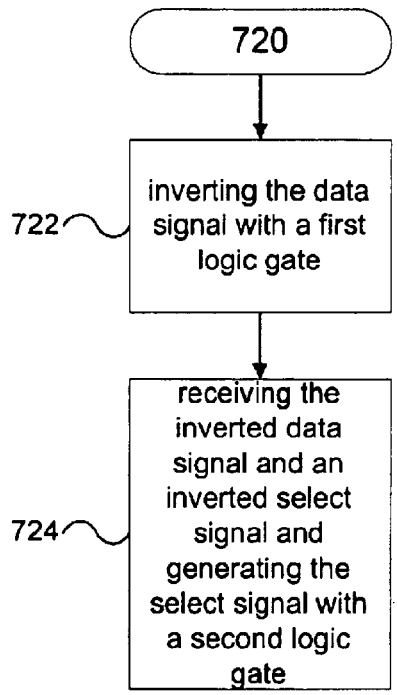

Further, those skilled in the art will appreciate from the foregoing description methods in accordance with embodiments of the present invention. Accordingly, an embodiment of the present invention is illustrated in FIGS. 7A and 7B. The method comprises receiving a data signal D1 from a domino logic circuit in block 710 and preventing a select signal S1 from being high when a precharge edge of the data signal D1 arrives in block 720.

For example, as illustrated in FIG. 3A, the data signal D1 can be inverted with a first logic gate 302. The inverted data signal D1-bar and an inverted select signal S1-bar can be received by a second logic gate 304 and the second logic gate 304 can generate the select signal S1. Data signal D1 can be from a domino logic circuit input to the pseudo-dynamic latch.

Accordingly, as illustrated in FIG. 7B, the method of block 720 can include inverting the data signal D1 with a first logic gate, in block 722 and receiving the inverted data signal D1-bar and an inverted select signal S1-bar and generating the select signal S1 with a second logic gate, in block 724. A state change of the select signal S1 is generated two gate delays after a state change of the data signal D1. Thus, the method prevents the select signal S1 from going to a high state before the precharge edge of the data signal D1 arrives.

The foregoing embodiments and advantages are merely exemplary and are not to be construed as limiting the present invention. The present teaching can be readily applied to other types of apparatuses. The description of embodiments of the present invention is intended to be illustrative, and not to limit the scope of the claims. Many alternatives, modifications, and variations will be apparent to those skilled in the art. In the claims, means-plus-function clauses if used are intended to cover the structures described herein as performing the recited function and not only structural equivalents but also equivalent structures.

What is claimed is:

1. An apparatus comprising:
    a pseudo-dynamic latch; and
    a deracer circuit configured to prevent a select signal from being high when a precharge edge of a data signal arrives.

2. The apparatus of claim 1, wherein the deracer circuit comprises:
    a first logic gate configured to receive the data signal from a domino logic circuit and to invert the data signal; and
    a second logic gate configured to receive the data signal and an inverted select signal and to generate the select signal.

3. The apparatus of claim 2, wherein the deracer circuit is configured to generate a state change of the select signal two gate delays after a state change of the data signal.

4. The apparatus of claim 3, wherein the deracer circuit is configured to prevent the select signal from going to a high state before the pseudo-dynamic latch goes into a hold state from an evaluate state.

5. The apparatus of claim 2, wherein the first logic gate is an inverter and the second logic gate is a NOR gate.

6. The apparatus of claim 1, wherein the data signal is a domino-precharge signal that is precharged to a high state.

7. The apparatus of claim 1, wherein the apparatus is at least one of a multiplexer, an Arithmetic Logic Unit (ALU), a memory and a microprocessor.

8. The apparatus of claim 1, wherein the deracer circuit comprises:
   a first logic gate configured to receive an negative logic clock signal and to invert the negative logic clock signal; and
   a second logic gate configured to receive the inverted negative logic clock signal and an inverted select signal and to generate the select signal.

9. The apparatus of claim 8, wherein the first and second logic gates are configured to prevent the select signal from going to a high state before a the pseudo dynamic latch goes into a hold state from an evaluate state.

10. The apparatus of claim 8, wherein the first logic gate is an inverter and the second logic gate is a NOR gate.

11. The apparatus of claim 1, wherein the deracer circuit comprises:
    a logic gate configured to receive a clock signal and an inverted select signal and to generate the select signal.

12. The apparatus of claim 11, wherein the logic gate prevents the select signal from going to a high state before the pseudo-dynamic latch goes into a hold state.

13. The apparatus of claim 11, wherein the logic gate is a NOR gate.

14. A latch comprising:
    a deracer circuit configured to prevent a select signal from being high when a precharge edge of a data signal arrives.

15. The latch of claim 14, wherein the deracer circuit comprises:
    a first logic gate configured to receive the data signal from a domino logic circuit and to invert the data signal; and
    a second logic gate configured to receive the data signal and an inverted select signal and to generate the select signal.

16. The latch of claim 15, wherein the deracer circuit is configured to generate a state change of the select signal two gate delays after a state change of the data signal.

17. The latch of claim 15, wherein the select signal and data signal are in a pull down path of the latch.

18. The latch of claim 15, wherein the first logic gate is an inverter and the second logic gate is a NOR gate.

19. The latch of claim 15, wherein the data signal is a domino-precharge signal that is precharged to a high state.

20. A method for implementing a pseudo-dynamic latch, the method comprising:
    receiving a data signal from a domino logic circuit; and
    preventing a select signal from being high when a precharge edge of the data signal arrives.

21. The method of claim 20, further comprising:
    inverting the data signal with a first logic gate; and
    receiving the inverted data signal and an inverted select signal and generating the select signal with a second logic gate.

22. The method of claim 21, further comprising:
    generating a state change of the select signal two gate delays after a state change of the data signal.

23. The method of claim 22, further comprising:
    preventing the select from going to a high state before the pseudo-dynamic latch goes into a hold state from an evaluate state.

24. The method of claim 21, wherein the data signal is a domino-precharge signal that is precharged to a high state.

25. The method of claim 21, wherein the first logic gate is an inverter and the second logic gate is a NOR gate.

26. A system comprising:
    a microprocessor; and
    an off-die component in communication with the microprocessor; wherein the microprocessor comprises a pseudo-dynamic latch including a deracer circuit, wherein the deracer circuit is configured to prevent a select signal from being high when a precharge edge of a data signal arrives.

27. The system of claim 26, wherein the deracer circuit comprises:
    a first logic gate configured to receive the data signal from a domino logic circuit and to invert the data signal;
    a second logic gate configured to receive the inverted data signal and an inverted select signal and to generate the select signal.

28. The system of claim 27, wherein the deracer circuit is configured to generate a state change of the select signal two gate delays after a state change of the data signal.

29. The system of claim 27, wherein the deracer circuit is configured to prevent the select signal from going to a high state before the pseudo-dynamic latch goes into a hold state from an evaluate state.

30. The system of claim 27, wherein the first logic gate is an inverter and the second logic gate is a NOR gate.

* * * * *